US008471632B2

(12) United States Patent
Onishi et al.

(10) Patent No.: US 8,471,632 B2
(45) Date of Patent: Jun. 25, 2013

(54) DISTORTION COMPENSATION CIRCUIT

(75) Inventors: Masahiko Onishi, Osaka (JP); Mikhail Illarionov, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 41 days.

(21) Appl. No.: 13/141,588

(22) PCT Filed: Sep. 30, 2009

(86) PCT No.: PCT/JP2009/067036
§ 371 (c)(1),
(2), (4) Date: Jun. 22, 2011

(87) PCT Pub. No.: WO2010/073789
PCT Pub. Date: Jul. 1, 2010

(65) Prior Publication Data
US 2011/0254623 A1     Oct. 20, 2011

(30) Foreign Application Priority Data

Dec. 24, 2008   (JP) ................................. 2008-327917

(51) Int. Cl.
*H03F 1/26*        (2006.01)
(52) U.S. Cl.
USPC ........................................................ 330/149
(58) Field of Classification Search
USPC ................... 330/149; 375/296, 297; 455/63, 455/1, 114.3
See application file for complete search history.

(56) References Cited

U.S. PATENT DOCUMENTS

| 6,744,315 B2 * | 6/2004 | Ezuka ........................... 330/149 |
| 7,514,996 B2 * | 4/2009 | Furuta et al. .................. 330/149 |

(Continued)

FOREIGN PATENT DOCUMENTS

| JP | 08-079143 | 3/1996 |
| JP | 2002-009556 | 1/2002 |

(Continued)

OTHER PUBLICATIONS

International Preliminary Report on Patentability and Written Opinion of the International Searching Authority, issued in International Patent Application No. PCT/JP2009/067036, dated Aug. 9, 2011.

(Continued)

*Primary Examiner* — Khanh V Nguyen
(74) *Attorney, Agent, or Firm* — McDermott Will & Emery LLP

(57) ABSTRACT

Disclosed is a distortion compensation circuit that efficiently compensates for distortion. A distortion compensation circuit (20) comprises a sampling memory unit (21), which accumulates an input signal and an output signal from an amplifier (4), a model estimation unit (22), which reads the input and output signals that are accumulated upon the sampling memory unit (21), estimates a model that represents an input/output characteristic of the amplifier (4), and outputs a coefficient that denotes the model thus estimated, and a distortion compensation unit (23), which compensates for a distortion of the amplifier (4), based on the coefficient. The distortion compensation circuit (20) further comprises a control unit (25), which causes the accumulation of the input signal and the output signal upon the sampling memory unit (21) of a predetermined length, and controls the sampling memory unit (21) to accumulate the input and output signals anew in order to obtain a new coefficient after the distortion compensation is carried out by the distortion compensation unit (23) according to the coefficient that is obtained from the input and output signals that have been accumulated upon the memory unit.

7 Claims, 3 Drawing Sheets

U.S. PATENT DOCUMENTS

| | | | |
|---|---|---|---|
| 7,737,779 B2 * | 6/2010 | Summerfield et al. | ........ 330/149 |
| 2002/0010567 A1 | 1/2002 | Kusunoki | |
| 2008/0197925 A1 | 8/2008 | Furuta et al. | |

FOREIGN PATENT DOCUMENTS

| | | |
|---|---|---|
| JP | 2002-082843 | 3/2002 |
| JP | 2007-248115 | 9/2007 |
| JP | 2008-295089 | 12/2008 |

OTHER PUBLICATIONS

Lei Ding et al., "A Robust Digital Baseband Predistorter Constructed Using Memory Polynomials," IEEE Transactions on Communications, Jan. 2004, vol. 52, No. 1, pp. 159-165.

Thesis by Lei Ding, "Digital Predistortion of Power Amplifiers for Wireless Application," Georgia Institute of Technology, Mar. 2004.

* cited by examiner

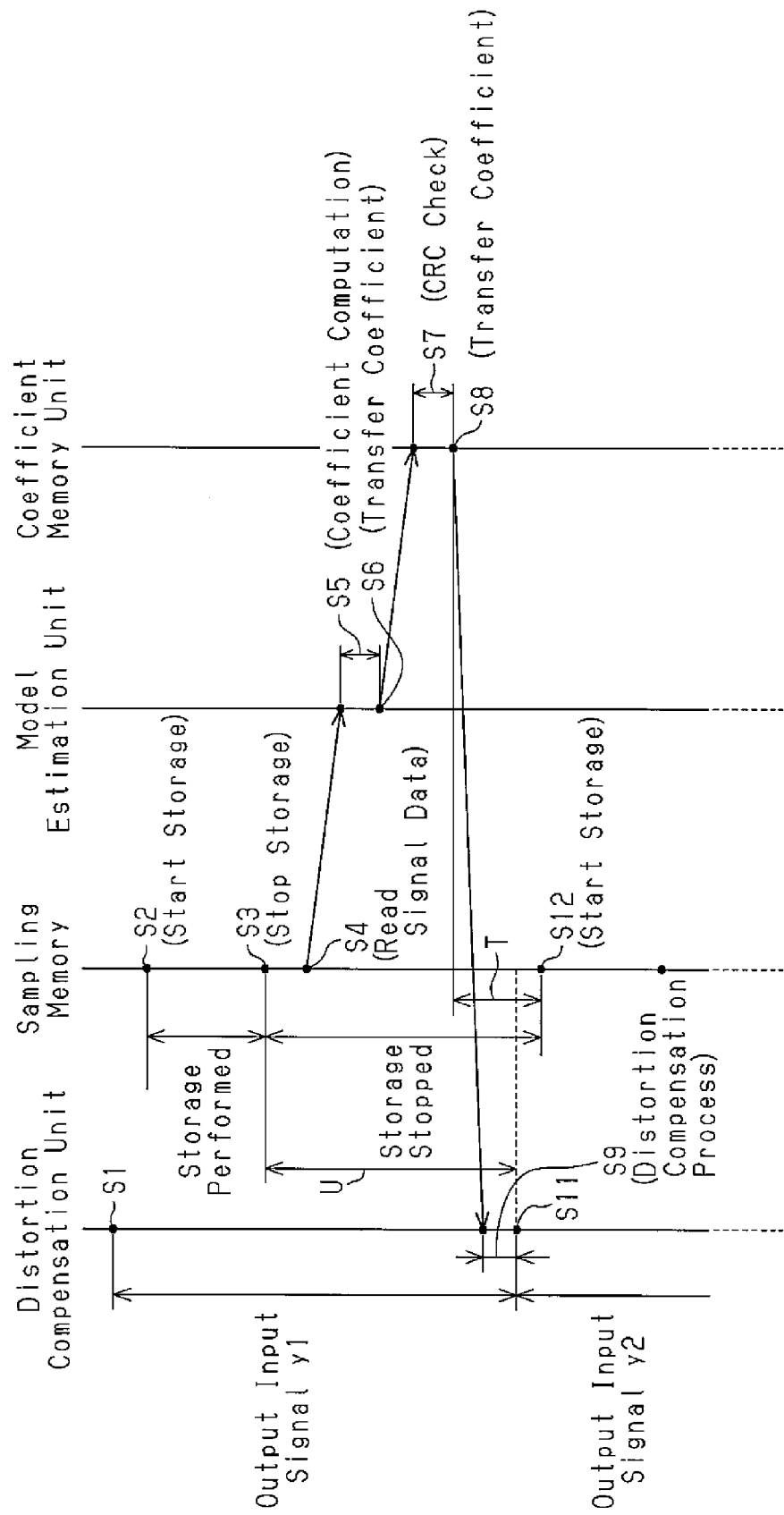

DISTORTION COMPENSATION CIRCUIT

RELATED APPLICATIONS

This application is the U.S. National Phase under 35 U.S.C. §371 of International Application No. PCT/JP2009/067036, filed on Sep. 30, 2009, which in turn claims the benefit of Japanese Application No. 2008-327917, filed on Dec. 24, 2008, the disclosures of which Applications are incorporated by reference herein.

TECHNICAL FIELD

The present invention relates to a distortion compensation circuit that functions to compensate for nonlinear characteristics of a high power amplifier used in a wireless transceiver.

BACKGROUND ART

A high output amplifier (HPA) having high efficiency generally has input/output characteristics with low linearity. When power is amplified using such amplifier, the desired output may not be obtained due to distortion of input/output characteristics. Thus, in order to compensate for the distortion of the amplifier, a distortion compensation circuit that obtains the desired amplifier output by performing a distortion compensation process for generating an inverse distortion characteristic, which is inverse to the distortion characteristic of the amplifier, through digital signal processing on an input signal of the amplifier and adding the inverse distortion characteristics to the input of the amplifier has been proposed (for example, refer to non-patent document 1).
Non-Patent Document 1: Thesis by Lei Ding, "Digital pre-distortion of power amplifiers for wireless application", Georgia institute of Technology, March 2004

DISCLOSURE OF THE INVENTION

In the distortion compensation circuit described above, the distortion is not completely compensated by once acquiring the input signal and the output signal of the amplifier, and the procedures of acquiring the input signal and the output signal of the amplifier, estimating the inverse distortion characteristic of the amplifier based on the input and output signals, performing the distortion compensation process, and again acquiring the input and output signals of the amplifier needs to be carried out a number of times to gradually compensate the distortion.

The distortion compensation circuit takes time to perform the estimation of the inverse distortion characteristic and the distortion compensation process from when the input and output signals are acquired until the effect of the distortion compensation is reflected on the input signal of the amplifier. Thus, when the distortion compensation is performed based on the input and output signals acquired in a certain time period and the input and output signals are re-acquired in a time period immediately after the time period in which the input and output signals are re-acquired, the effect of the distortion compensation by the distortion compensation process is not reflected on the re-acquired input and output signals. Further, the distortion compensation process is based on the input and output signals that are substantially the same as the input and output signals acquired immediately before the distortion compensation process. The conventional distortion compensation circuit has a problem in that such useless process is carried out and that distortion compensation is not efficiently performed.

It is an object of the present invention to provide a distortion compensation circuit that performs distortion compensation with further efficiency.

To achieve the above object, a distortion compensation circuit includes a memory unit that stores an input signal and an output signal of an amplifier. A model estimation unit reads the input signal and the output signal stored in the memory unit, estimates a model representing input/output characteristics of the amplifier, and outputs a parameter indicating the estimated model. A distortion compensation unit performs a distortion compensation for the amplifier based on the parameter output by the model estimation unit. A control unit stores the input signal and the output signal corresponding to a predetermine time in the memory unit and controls the memory unit to re-store the input signal and the output signal in order to obtain a new parameter after the distortion compensation unit performs distortion compensation with the parameter obtained from the input signal and the output signal stored in the memory unit.

In the above-described distortion compensation circuit, the control unit stores the input signal and the output signal corresponding to a predetermine time in the memory unit and controls the memory unit to re-store the input signal and the output signal in order to obtain a new parameter after the distortion compensation unit performs distortion compensation with the parameter obtained from the input signal and the output signal stored in the memory unit. Thus, after the input signal and the output signal corresponding to the predetermined time is stored in the memory unit, the input and output signals of the amplifier are not stored in the memory unit until distortion compensation is performed (input and output signals reflecting distortion compensation performed with the parameter obtained from the input signal and output signal stored in the memory unit). Accordingly, the input and output signals stored in the memory unit reflects the effect of the distortion compensation based on the immediately previous input and output signals stored in the memory unit.

This prevents a situation in which the acquired input and output signals do not reflect the effect of the distortion compensation based on the immediately previous input and output signals like in the prior art. However, the above-described state prevents such a situation and performs distortion compensation with further efficiency.

In the above-described distortion compensation circuit, the memory unit may be set to have a capacity allowing for storage of the input signal and the output signal corresponding to the predetermined time and may be formed by a memory that disables data writing in a memory-full state.

In this case, the control unit easily recognizes that the input and output signals corresponding to the predetermined time are stored in the memory when the memory is in the memory full state. Further, the control unit easily controls the memory to stop the storage of the input and output signals with the memory 21.

BRIEF DESCRIPTION OF THE DRAWINGS

FIG. 3 is a sequence chart showing the relationship of processes performed by a sampling memory, a model estimation unit, a coefficient memory unit, and a distortion compensation unit.

DETAILED DESCRIPTION OF THE EMBODIMENTS

Embodiments of the present invention will now be described with reference to the drawings.

Figure 1:
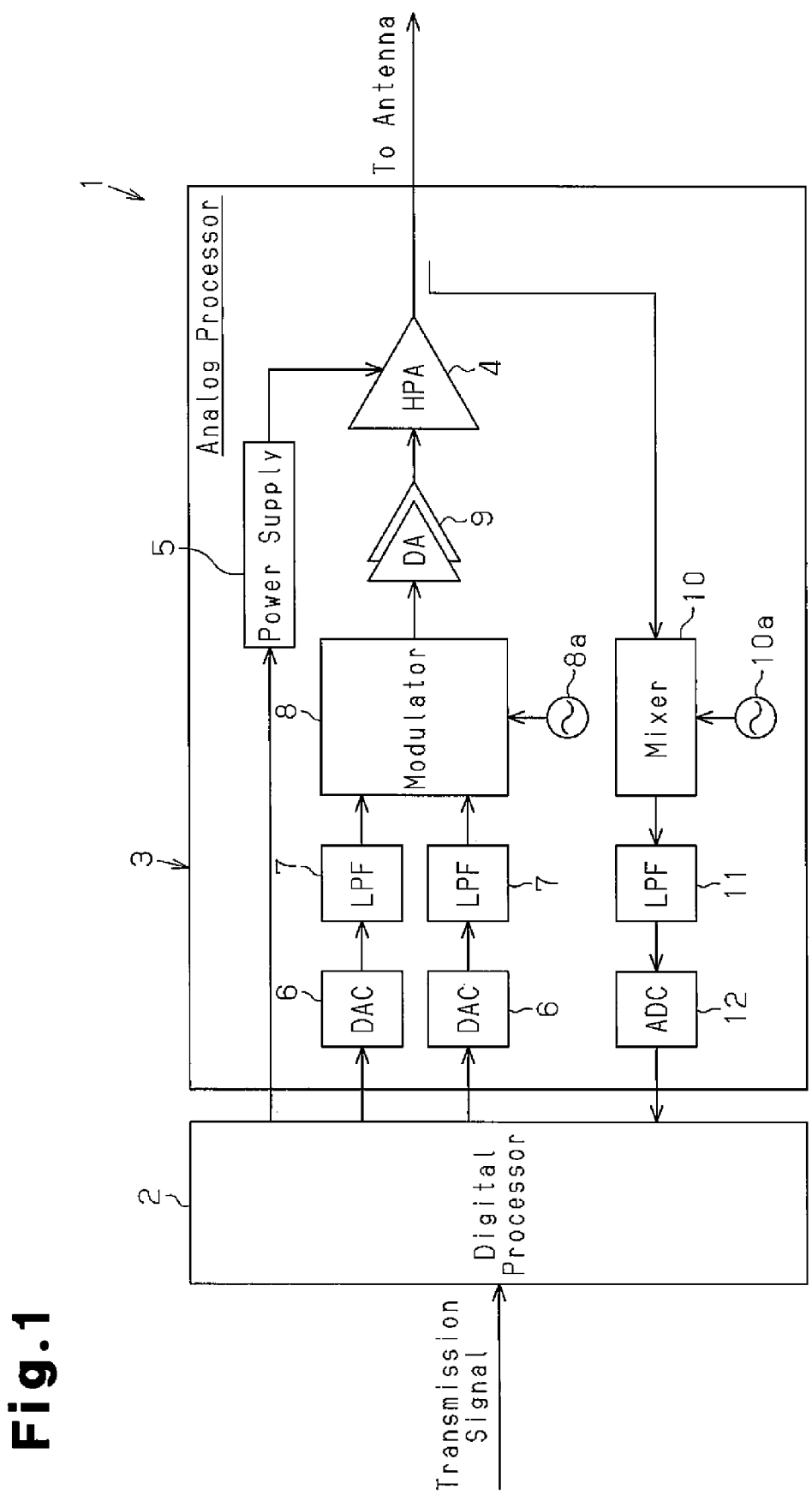
FIG. 1 is a circuit diagram showing the hardware structure of an amplifier device incorporating a distortion compensation circuit according to the present invention.

FIG. 1 is a circuit diagram showing the hardware structure of an amplifier device 1 incorporating a distortion compensation circuit according to the present invention. The amplifier device 1 amplifies a transmission signal of a wireless communication device or the like and includes a digital processor 2, which functionally includes a distortion compensation circuit, and an analog processor 3, which includes a high power amplifier (HPA, hereinafter, also referred to as amplifier) 4.

The digital processor 2 provides the analog processor 3 with a transmission signal serving as an input signal that is input to the amplifier 4, and acquires an output signal, which is output by the amplifier 4, from the analog processor 3.

The analog processor 3 includes a power supply 5, which supplies power supply voltage to the amplifier 4 in addition to a digital-to-analog (DA) converter (DAC) 6, a low pass filter (LPF) 7, a modulator 8 functioning as a mixer for mixing signals with an oscillator 8a, and a driver amplifier 9 arranged and connected between the digital processor 2 and a signal input terminal of the amplifier 4. The input signal output by the digital processor 2 is provided to the amplifier 4 through these components. The digital processor 2 outputs a signal prior to quadrature modulation that includes an in-phase component and a quadrature component to the analog processor 3. The analog processor 3 includes the digital-to-analog (DA) converter (DAC) 6 and the low pass filter 7 for each of the two components of the signal. Both components, which are analog-converted by the DA converter 6, are subjected to quadrature modulation by the modulator 8 and input to the amplifier 4.

The analog processor 3 includes a mixer 10 that mixes signals with an oscillator 10a, a low pass filter 11, and an analog-to-digital (AD) converter (ADC) 12 arranged and connected between a signal output terminal of the amplifier 4 and the digital processor 2. The digital processor 2 acquires the output signal from the amplifier 4 through these components. Accordingly, in the present embodiment, the digital processor 2 acquires the output signal from the amplifier 4 as a signal in a quadrature modulated state.

Figure 2:
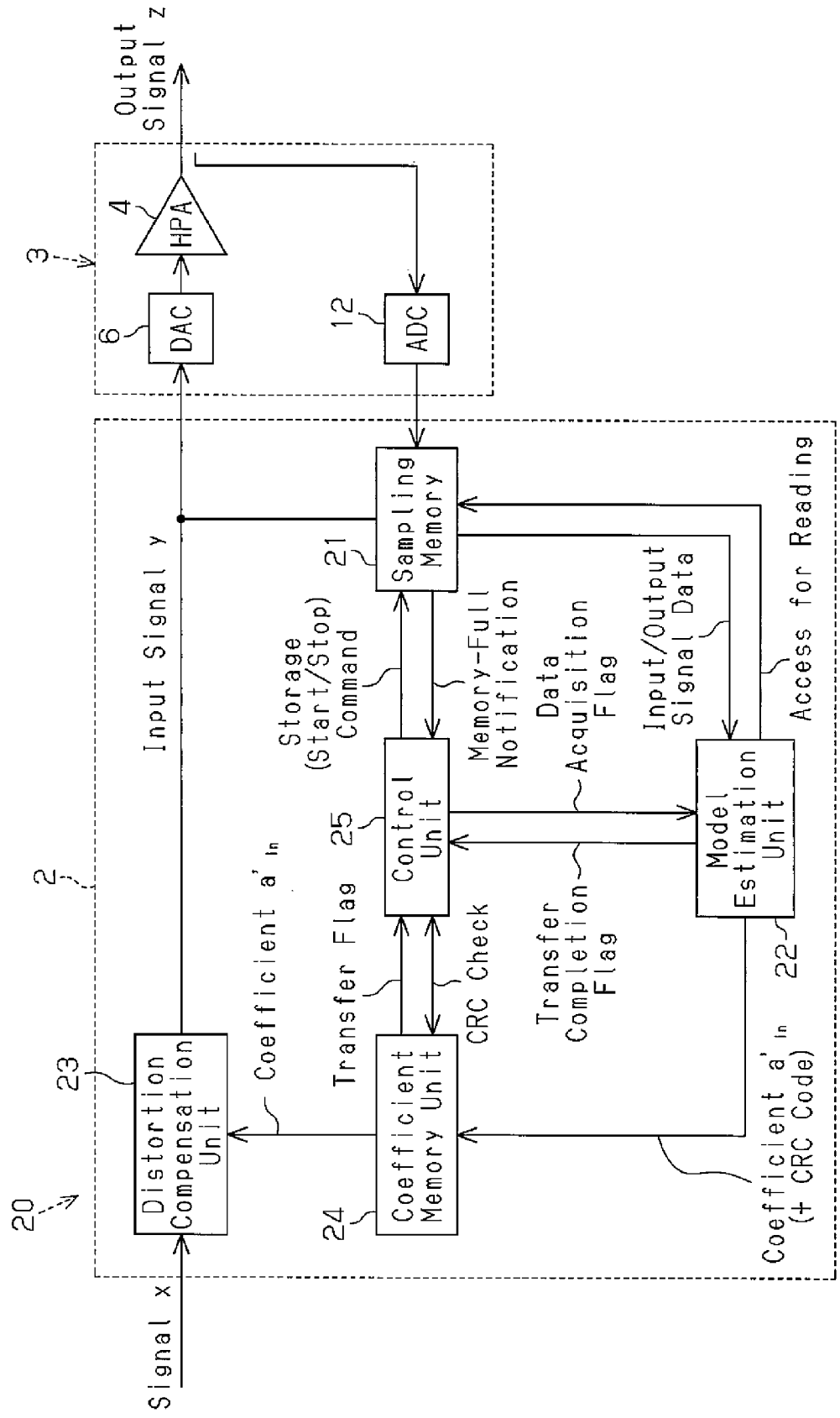
FIG. 2 is a block diagram showing the configuration of a distortion compensation circuit functionally included in a digital processor.

FIG. 2 is a block diagram showing the configuration of a distortion compensation circuit 20, which is functionally included in the digital processor 2.

The distortion compensation circuit 20 performs a distortion compensation process on the amplification characteristic of the amplifier 4 based on the input signal to the amplifier 4 and the output signal of the amplifier 4 acquired from the analog processor 3 to obtain the desired amplification characteristics. Further, the distortion compensation circuit 20 includes a sampling memory 21 that stores an input signal y and an output signal z of the amplifier 4, a model estimation unit 22 that reads the input and output signals y and z stored in the sampling memory 21 and estimates a model representing the input/output characteristics of the amplifier 4, a distortion compensation unit 23 that performs distortion compensation of the amplifier 4 based on the model, a coefficient memory unit 24 that stores a coefficient indicating the model output from the model estimation unit 22, and a control unit 25 that controls the operation of the sampling memory 21.

The distortion compensation unit 23 performs the distortion compensation process corresponding to the distortion characteristics of the amplifier 4 on a signal (signal prior to distortion compensation) x provided to the amplifier device 1, and outputs an input signal y (signal subsequent to distortion compensation) that is input to the amplifier 4. The amplifier 4 receives the input signal y performed with the distortion compensation in advance from the distortion compensation unit 23. This allows for the amplifier 4 to output an output signal z free from (or including a small amount of) distortion.

The input/output characteristics of the amplifier 4, which are nonlinear, are expressed with a power polynomial of equation (1), which is shown below. In equation (1), z(t) is the output signal of the amplifier 4 at a certain time t, y(t) is the input signal of the amplifier 4, i is the order, n is the time width indicating the timing temporally moved to the past (previous timing) or the future (future timing) from time t, and $a_{in}$ is a coefficient of each order corresponding to the time width n. Equation (1) is shown as a characteristic that also takes into consideration past and future signals in addition to the current signal.

Equation 1

$$z(t) = \sum_n \sum_i a_{in} \cdot |y(t-n)|^{i-1} y(t-n) \quad (1)$$

The distortion compensation unit 23 calculates the power series polynomial shown in equation (2) based on equation (1) to obtain the input signal y(t) of the amplifier 4. In equation (2), $a_{in}'$ is the coefficient of each order indicating the inverse characteristics of the amplifier.

Equation 2

$$y(t) = \sum_n \sum_i a_{in}' \cdot |x(t-n)|^{i-1} x(t-n) \quad (2)$$

As shown in equation (2), the distortion compensation unit 23 performs distortion compensation by adding the inverse characteristics of the distortion characteristics of the amplifier 4 to the signal x(t) based on the coefficient $a_{in}'$ of each order indicating the inverse characteristics of the amplifier 4 serving as a model representing the input/output characteristics of the amplifier 4 to cancel the distortion caused by the amplifier 4.

The coefficient $a_{in}'$ of each order indicating the inverse characteristics of the amplifier 4 in equation (2) is obtained by the model estimation unit 22. The model estimation unit 22 reads the input/output signal data related to the input signal y(t) and the output signal z(t) of the amplifier 4 stored in the sampling memory 21, estimates a model representing the input/output characteristics of the amplifier 4 based on the input/output signal data, and obtains the coefficient $a_{in}'$ of each order serving as a parameter indicating the estimated model.

In the description of equation (1) and equation (2), the signal prior to the distortion compensation, the input signal, and the output signal are indicated as x(t), y(t), and z(t) but are indicated as x, y, and z in the following description.

In the present embodiment, the input signal y of the input and output signals y, z of the amplifier stored in the sampling memory 21 is a signal prior to the quadrature modulation, whereas the output signal z in a state acquired from the analog processor 3 is a signal that has undergone the quadrature modulation. Thus, the model estimation unit 22 first performs quadrature demodulation of the output signal z. Then, the input signal y and the output signal z are synchronized in terms of signal pattern, frequency, phase, or the like. The input and output signals y and z are used for the calculation of the coefficient $a_{in}'$.

The model estimation unit 22 includes an amplifier model (inverse model) in which the input signal y is expressed with a power polynomial of the output signal z, in which an estimated value of the input signal y is obtained by applying the output signal z read from the sampling memory 21 to the model. Further, the model estimation unit 22 estimates a model in which a difference between the estimated value and the input signal y read out from the sampling memory 21 becomes minimum as a model representing the current input/output characteristics of the amplifier 4. The model estimation unit 22 obtains the coefficient of each order of the estimated model, and outputs the coefficient as the coefficient $a_{in}'$ of each order indicating the inverse characteristics of the amplifier 4.

When outputting the coefficient $a_{in}'$, the model estimation unit 22 adds a CRC code to the information indicating the coefficient $a_{in}'$ The model estimation unit 22 outputs the coefficient $a_{in}'$ to the coefficient memory unit 24. The coefficient memory unit 24 temporarily stores such coefficient $a_{in}'$. The stored coefficient $a_{in}'$ undergoes the CRC check performed by the control unit 25. This allows for the coefficient $a_{in}'$ to be checked whether or not normal transfer occurred between the model estimation unit 22 and the coefficient memory unit 24, and the subsequent distortion compensation process is prevented from being carried out with the wrong coefficient.

The coefficient memory unit 24 outputs the coefficient $a_{in}'$ to the distortion compensation unit 23 after the CRC check performed by the control unit 25. As described above, the distortion compensation unit 23 outputs the input signal y (signal subsequent to distortion compensation) that is input to the amplifier 4 to the amplifier 4 of the analog processor 3 based on the coefficient $a_{in}'$ and the signal x prior to distortion compensation provided to the amplifier device 1.

The amplifier 4 thus receives the input signal y in which the distortion compensation has been performed on the signal x in advance, and allows for output of an output signal z free from (or includes a small amount of) distortion.

The control unit 25 performs the control on the operation of the sampling memory 21, as described above. Specifically, the control unit 25 controls the sampling memory 21 to stop or start the storage of the input and output signals y and z of the amplifier 4. The sampling memory 21 also allows the input/output signal data related to the input and output signals y and z stored by the model estimation unit 22 in accordance with access from the model estimation unit 22.

The mode of control of the sampling memory 21 by the control unit 25 and the relationship with other functional units will now be described.

FIG. 3 is a sequence chart showing the relationship of the processes performed by the sampling memory 21, the model estimation unit 22, the coefficient memory unit 24, and the distortion compensation unit 23. In FIG. 2, the data, flag, and the like that are mutually transmitted and received by the processes shown in FIG. 3 are also shown.

With reference to FIG. 2 and FIG. 3, first, in step S1 of FIG. 3, the digital processor 2 outputs the input signal y1 of the amplifier 4 to the analog processor 3 through the distortion compensation performed immediately before the distortion compensation unit 23. As a result, it is assumed that the output signal z1 of the amplifier 4 is acquired from the analog processor 3 with the input signal y1. In the stage of step S1, the control unit 25 controls the sampling memory 21 to stop storing the input and output signals y and z.

After step S1, the control unit 25 starts storing the input and output signals y and z in the sampling memory 21 (step S2). As a result, the sampling memory 21 starts to store the input signal y1 currently output from the distortion compensation unit 23 and the corresponding output signal z1 that is output from the amplifier 4. The timing for starting the storage of the input and output signals y and z with the sampling memory 21 in step S2 will be described later.

The sampling memory 21 is formed by a memory set to a have a capacity that becomes memory-full when storing the input/output signal data related to the input and output signals y and z corresponding to a predetermined time (predetermined size) at which the model estimation unit 22 acquires the information necessary for calculating the coefficient $a_{in}'$. The sampling memory 21 is formed so that writing is disabled in the memory-full state. Thus, the sampling memory 21 cannot further store the input and output signals y and z after reaching the memory full state. In the present embodiment, the sampling memory 21 is formed by a FIFO memory.

The sampling memory 21 thus starts to store the input and output signals y1 and z1 in step S2. When reaching the memory-full state, the sampling memory 21 notifies the control unit 25 of such state.

Upon receipt of notification of a memory full state from the sampling memory 21, the control unit 25 controls the sampling memory 21 to stop storing the input and output signals y and z (step S3). Specifically, the control unit 25 sends a command to stop storing the input and output signals y and z (command for stopping the write side port of the sampling memory 21) to the sampling memory 21. In the present example, the period from when the sampling memory 21 starts storage of the input and output signals y1 and z1 in step S2 until stopping storage of the input and output signals y1 and z1 in step S3 corresponds to the first sampling period. Then, the sampling memory 21 continues to stop storing the input and output signals y and z until receiving a command to start storing the input and output signals y and z (command to operate the write side port).

In this manner, the control unit 25 stores the input/output signal data related to the input and output signals y and z corresponding to the predetermined time in the sampling memory 21.

The control unit 25 transmits a data acquisition flag to the model estimation unit 22 so that the model estimation unit 22 reads and acquires the input/output signal data related to the input and output signals y1 and z1 stored in the sampling memory 21. When receiving the data acquisition flag, the model estimation unit 22 accesses the sampling memory 21, reads the stored input/output signal data, and acquires the input/output signal data (step S4).

The model estimation unit 22, which acquired the input/output signal data, performs a calculation to obtain the coefficient $a_{in}'$ of each order indicating the inverse characteristics of the amplifier based on the input/output signal data related to the input and output signals y1 and z1 (step S5).

The model estimation unit 22 then transfers the obtained coefficient $a_{in}'$ to the coefficient memory unit 24 (step S6).

The coefficient memory unit 24 stores the transferred coefficient $a_{in}'$.

After all the coefficients $a_{in}'$ are transferred to the coefficient memory unit 24 and the transfer is completed, the model estimation unit 22 transmits a transfer completion flag indicating completion to the control unit 25.

The control unit 25 that receives the transfer completion flag recognizes that all the coefficients $a_{in}'$ obtained by the model estimation unit 22 are transferred to and stored in the coefficient memory unit 24. The control unit 25 performs the CRC check on the coefficient $a_{in}'$ stored in the coefficient memory unit 24 (step S7). After the control unit 25 finishes the CRC check on all the coefficients $a_{in}'$, the coefficient memory unit 24 transfers the coefficient $a_{in}'$ to the distortion compensation unit 23 (step S8).

The distortion compensation unit 23 that received the coefficient $a_{in}'$ from the coefficient memory unit 24 performs the distortion compensation process corresponding to the distortion characteristics of the amplifier 4 on the signal (signal prior to distortion compensation) x provided to the amplifier device 1 based on the coefficient $a_{in}'$ (step S9), and outputs the input signal y2 as the signal after the distortion compensation (step S11).

In step S8, the coefficient memory unit 24 transfers the coefficient $a_{in}'$ to the distortion compensation unit 23. At the same time, the coefficient memory unit 24 transmits a transfer flag to the control unit 25 notifying that the coefficient $a_{in}'$ has been transferred to the distortion compensation unit 23.

When receiving the transfer flag from the coefficient memory unit 24, the control unit 25 transmits a command (command to operate the write side port) to the sampling memory 21 to start storing the input and output signals y and z after a predetermined waiting time T elapses. This starts storing the input signal y2 currently output from the distortion compensation unit 23 and the corresponding output signal z2 output from the amplifier 4 with the sampling memory 21 (step S12). That is, the control unit 25 starts storing the input and output signals y and z in the sampling memory 21 at a timing when the waiting time T elapses from the transfer of the coefficient $a_{in}'$ to the distortion compensation unit 23 in step S8. In other words, the control unit 25 notifies the sampling memory 21 of the command for starting storage after the waiting time T elapses from the completion of the data error detection.

The waiting time T is set to a time that is sufficient for the coefficient $a_{in}'$ to be transferred to the distortion compensation unit 23, the distortion compensation process to be performed by the distortion compensation unit 23, the input signal y2 reflecting the distortion compensation by the coefficient $a_{in}'$ to be output from the distortion compensation unit 23, and the corresponding output signal z2 to be obtained.

Accordingly, the sampling memory 21 starts storing the input signal y2 reflecting the distortion compensation of the coefficient $a_{in}'$ obtained from the input and output signals y1 and z1 and the corresponding output signal z2 output from the amplifier 4. In the present example, the period from when the sampling memory 21 starts to store the input and output signals y2 and z2 until when the sampling memory 21 stops storing the input and output signals y2 and z2 corresponds to a second sampling period. Each sampling period is determined in accordance with the period until the memory unit 21 is determined as being memory full. Accordingly, the length of the second sampling period is normally different from the length of the first sampling period. However, the length of each sampling period may be the same.

In this manner, the control unit 25 controls the sampling memory 21 so that the input and output signals y2 and z2 for obtaining a new coefficient $a_{in}'$ are re-stored after the distortion compensation is performed with the coefficient $a_{in}'$ obtained from the input and output signals y1 and z1 stored in the sampling memory 21.

Step S11 and step S12 correspond to step S1 and step S2, and similar processes are repeated thereafter to perform the distortion compensation of the amplifier 4.

In the distortion compensation circuit 20 described above, the sampling memory 21 is controlled so that the input and output signals y (y1) and z (z1) corresponding to the predetermined time are stored in the sampling memory 21, and the input and output signals y (y2) and z (z2) for obtaining a new coefficient $a_{in}'$ are re-stored after the distortion compensation with the coefficient $a_{in}'$ obtained from the input and output signals y (y1) and z (z1) stored in the sampling memory 21 is performed by the distortion compensation unit 23. Thus, the input and output signals of the amplifier are not stored in the sampling memory 21 during a time width U, which is from when the input and output signals y (y1) and z (z1) corresponding to the predetermined time are stored in the sampling memory 21 until the distortion compensation is performed (input and output signals y (y2) and z (z2) reflecting the distortion compensation by the coefficient $a_{in}'$ obtained from the input and output signals y (y1), z (z1) stored in the sampling memory 21 are obtained).

Accordingly, the input and output signals y and z stored in the sampling memory 21 may reflect the effect of the distortion compensation based on the input and output signals stored in the sampling memory 21 immediately before the storage.

In the prior art, the acquired input and output signals do not reflect the effect of the distortion compensation based on the immediately previous input and output signals. However, the above-described state prevents such a situation and performs distortion compensation with further efficiency.

In the present embodiment, the sampling memory 21 is formed by a memory set to a capacity allowing for storage of input and output signals y and z corresponding to a predetermined time in which information required by the model estimation unit 22 to calculate the coefficient $a_{in}'$ can be acquired. Further, the memory disables writing in the memory full state. Thus, the input and output signals y and z corresponding to the predetermined time are stored in the sampling memory 21 when the sampling memory 21 is in the memory full state. As a result, the control unit 25 easily recognizes that the input and output signals corresponding to the predetermined time are stored in the sampling memory 21. Further, the control unit 25 easily controls the sampling memory 21 to stop the storage of the input and output signals y and z with the sampling memory 21.

The present invention is not limited to the embodiments described above. In the embodiment described above, the sampling memory 21 is formed by an FIFO memory. However, other types of memories may be used. The length of the sampling period for storing the input and output signals y and z may vary for each sampling. Furthermore, it should be recognized by those skilled in the art that the error detection of the coefficient $a_{in}'$ may be performed using other data error detection processes instead of CRC.

The embodiments disclosed herein are to be considered as illustrative in all aspects and not restrictive. The present invention is not to be limited to the details given herein, but may be modified within the scope and equivalence of the scope of claims.

The invention claimed is:

1. A distortion compensation circuit comprising:
    a memory unit that stores an input signal and an output signal of an amplifier;
    a model estimation unit that reads the input signal and the output signal stored in the memory unit, estimates a model representing input/output characteristics of the amplifier, and outputs a parameter indicating the estimated model;
    a distortion compensation unit that performs a distortion compensation for the amplifier based on the parameter output by the model estimation unit; and a control unit that stores the input signal and the output signal corresponding to a predetermine time in the memory unit and controls the memory unit to re-store the input signal and the output signal in order to obtain a new parameter after the distortion compensation unit performs distortion compensation with a parameter obtained from the input signal and the output signal stored in the memory unit.

2. The distortion compensation circuit according to claim 1, wherein the memory unit is formed by a memory that has a capacity allowing for storage of the input signal and the output signal corresponding to the predetermined time and disables data writing in a memory-full state.

3. The distortion compensation circuit according to claim 1, wherein:

the memory unit first stores a first input signal, which is output from the distortion compensation unit, and a first output signal, which is output from the amplifier in correspondence with the first input signal, the model estimation unit generates a first parameter based on the first input signal and the first output signal, and the distortion compensation unit performs distortion compensation with the first parameter to generate a second input signal; and once the memory unit retrieves the first input signal and the first output signal, the memory unit stops storage operation until the second input signal, which reflects the distortion compensation performed with the first parameter, is output from the distortion compensation unit.

4. The distortion compensation circuit according to claim 3, wherein when the amplifier outputs a second output signal in correspondence with the second input signal, the memory unit re-starts the storage operation to retrieve the second input signal and the second output signal.

5. The distortion compensation circuit according to claim 3, wherein the memory unit retrieves the first input signal and the first output signal only once in a first sampling period that is shorter than a period in which the first input signal is output from the distortion compensation unit.

6. The distortion compensation circuit according to claim 5, wherein the control unit performs data error detection on the first parameter during a period of a predetermined time width from after the first sampling period while controlling the memory unit to stop the storage operation during the period of the predetermined time width.

7. The distortion compensation circuit according to claim 6, wherein the control unit notifies the memory unit of a start command of the storage operation after a predetermined waiting time elapses from completion of the data error detection, and the memory unit retrieves the second input signal and a second output signal, which is output from the amplifier in correspondence with the second input signal, during a second sampling period in response to the start command.

* * * * *